United States Patent
Cheng et al.

(10) Patent No.: US 10,665,426 B2
(45) Date of Patent: May 26, 2020

(54) METHODS FOR THIN FILM MATERIAL DEPOSITION USING REACTIVE PLASMA-FREE PHYSICAL VAPOR DEPOSITION

(71) Applicant: APPLIED MATERIALS, INC., Santa Clara, CA (US)

(72) Inventors: Yana Cheng, San Jose, CA (US); Zhefeng Li, Fremont, CA (US); Chi Hong Ching, Santa Clara, CA (US); Yong Cao, San Jose, CA (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 48 days.

(21) Appl. No.: 14/986,168

(22) Filed: Dec. 31, 2015

(65) Prior Publication Data

US 2017/0125215 A1 May 4, 2017

Related U.S. Application Data

(63) Continuation of application No. 62/247,578, filed on Oct. 28, 2015.

(51) Int. Cl.
*H01J 37/32* (2006.01)
*C23C 14/00* (2006.01)
*H01J 37/34* (2006.01)

(52) U.S. Cl.
CPC .... *H01J 37/32064* (2013.01); *C23C 14/0036* (2013.01); *H01J 37/32449* (2013.01); *H01J 37/3426* (2013.01); *H01J 37/3464* (2013.01)

(58) Field of Classification Search
CPC .............. H01J 37/32064; C23C 14/34; C23C 14/0073; C23C 14/025; C23C 14/0641; C23C 14/081; C23C 14/3414; C23C 14/3492
See application file for complete search history.

(56) References Cited

U.S. PATENT DOCUMENTS

| | | | |
|---|---|---|---|
| 6,716,545 B1 * | 4/2004 | Holesinger | ........... C04B 35/053 428/701 |
| 2001/0050220 A1 | 12/2001 | Chiang et al. | |
| 2006/0042930 A1 * | 3/2006 | Mauri | .................... B82Y 25/00 204/192.15 |

(Continued)

*Primary Examiner* — Brigitte A Paterson
(74) *Attorney, Agent, or Firm* — Moser Taboada; Alan Taboada

(57) ABSTRACT

Methods are disclosed for depositing a thin film of compound material on a substrate. In some embodiments, a method of depositing a layer of compound material on a substrate include: flowing a reactive gas into a plasma processing chamber having a substrate to be sputter deposited disposed therein in opposition to a sputter target comprising a metal; exciting the reactive gas into a reactive gas plasma to react with the sputter target and to form a first layer of compound material thereon; flowing an inert gas into the plasma processing chamber; and exciting the inert gas into a plasma to sputter a second layer of the compound material onto the substrate directly from the first layer of compound material. The cycles of target poisoning and sputtering may be repeated until a compound material layer of appropriate thickness has been formed on the substrate.

18 Claims, 4 Drawing Sheets

(56) References Cited

U.S. PATENT DOCUMENTS

| | | | |
|---|---|---|---|
| 2007/0138492 A1* | 6/2007 | Kamikawa | B82Y 20/00 |
| | | | 257/94 |
| 2007/0212896 A1 | 9/2007 | Olsen et al. | |
| 2012/0325310 A1* | 12/2012 | Chichibu | C23C 14/083 |
| | | | 136/256 |
| 2014/0042016 A1 | 2/2014 | Cao et al. | |
| 2014/0299951 A1* | 10/2014 | Guo | H01L 43/12 |
| | | | 257/421 |
| 2015/0064880 A1 | 3/2015 | Kim et al. | |
| 2016/0115417 A1* | 4/2016 | Gupta | C23C 14/06 |
| | | | 508/105 |

\* cited by examiner

METHODS FOR THIN FILM MATERIAL DEPOSITION USING REACTIVE PLASMA-FREE PHYSICAL VAPOR DEPOSITION

REFERENCE TO RELATED APPLICATIONS

The present application claims the benefit of priority to U.S. Provisional Patent Application Ser. No. 62/247,578 entitled "METHODS FOR THIN FILM MATERIAL DEPOSITION USING REACTIVE PLASMA-FREE PHYSICAL VAPOR DEPOSITION" and filed on Oct. 28, 2015, which is hereby incorporated herein by reference in its entirety.

FIELD

Embodiments of the present disclosure generally relate to substrate processing systems.

BACKGROUND

A nonconductive layer of dielectric material is often deposited between and over an electrically conductive layer of a substrate from which an integrated circuit is formed. The dielectric layer may serve several purposes, including electrically insulating a metal layer from other metal layers, insulating conductive features within a layer from one other, and protecting a metal layer and/or features from physical or chemical damage.

Features of modern integrated circuits are often of very fine pitch and high density. A single, small defect in a material layer forming part of a substrate can be so positioned as to seriously damage the operational integrity of the integrated circuit(s) fabricated from the substrate. In particular, the inventors herein have observed that deleterious interface interactions can arise between a thin film dielectric layer and an adjacent material layer of a substrate, especially where the thickness of the dielectric layer is on the order of tens of angstroms (A) (e.g., 10-50 Å).

Proposed by the inventors herein are systems and methods for reducing the interface interactions, between a thin film dielectric layer and one or more adjacent material layer(s) of a substrate, on the performance and reliability of integrated circuit devices formed from such a substrate.

SUMMARY

Methods are disclosed for depositing a thin film of compound material on a substrate. In some embodiments, a method of depositing a layer of compound material on a substrate includes: flowing a reactive gas into a plasma processing chamber having a substrate to be sputter deposited disposed therein in opposition to a sputter target comprising a metal; exciting the reactive gas into a reactive gas plasma to react with the sputter target and to form a first layer of compound material thereon; flowing an inert gas into the plasma processing chamber; and exciting the inert gas into a plasma to sputter a second layer of the compound material onto the substrate directly from the first layer of compound material. The cycles of target poisoning and sputtering may be repeated until a compound material layer of appropriate thickness has been formed on the substrate.

In some embodiments, a substrate processing system includes: a plasma processing chamber; a sputter target comprising a metal; a substrate support dimensioned and arranged within the plasma processing chamber to receive and support a substrate in opposition to a sputter target comprising a metal; and a controller comprising a processor and a memory, the memory containing instructions executable by the controller to flow one or more reactive gases into the plasma processing chamber, excite the reactive gas into a reactive gas plasma to react with a surface of the sputter target and form a first layer of compound material thereon, flow an inert gas into the plasma processing chamber, and excite the inert gas into a plasma to sputter a second layer of compound material onto the substrate directly from the first layer.

In some embodiments, a method of depositing a layer of compound material on a substrate includes: flowing a reactive gas into a plasma processing chamber having a substrate to be sputter deposited disposed therein in opposition to a sputter target comprising a metal; exciting the reactive gas into a reactive gas plasma to react with the sputter target and to form a first layer of compound material thereon; flowing an inert gas into the plasma processing chamber; exciting the inert gas into a plasma to sputter a second layer of the compound material onto the substrate directly from the first layer of compound material; in a second reactive gas flowing cycle following sputter deposition of the second layer of compound material on the substrate: flowing a reactive gas into the plasma processing chamber; and exciting the reactive gas of the second reactive gas flowing cycle into a reactive gas plasma to react with the sputter target and form a replacement layer of compound material thereon; and in a second inert gas flowing cycle: flowing an inert gas into the plasma processing chamber, and exciting the inert gas of the second inert gas flowing cycle into a plasma to sputter an additional layer of the compound material onto the substrate directly from the replacement layer.

Additional embodiments and features are set forth in part in the description that follows.

BRIEF DESCRIPTION OF THE DRAWINGS

A further understanding of the nature and advantages of the disclosed embodiments may be realized by reference to the remaining portions of the specification and the drawings.

Figure 1:
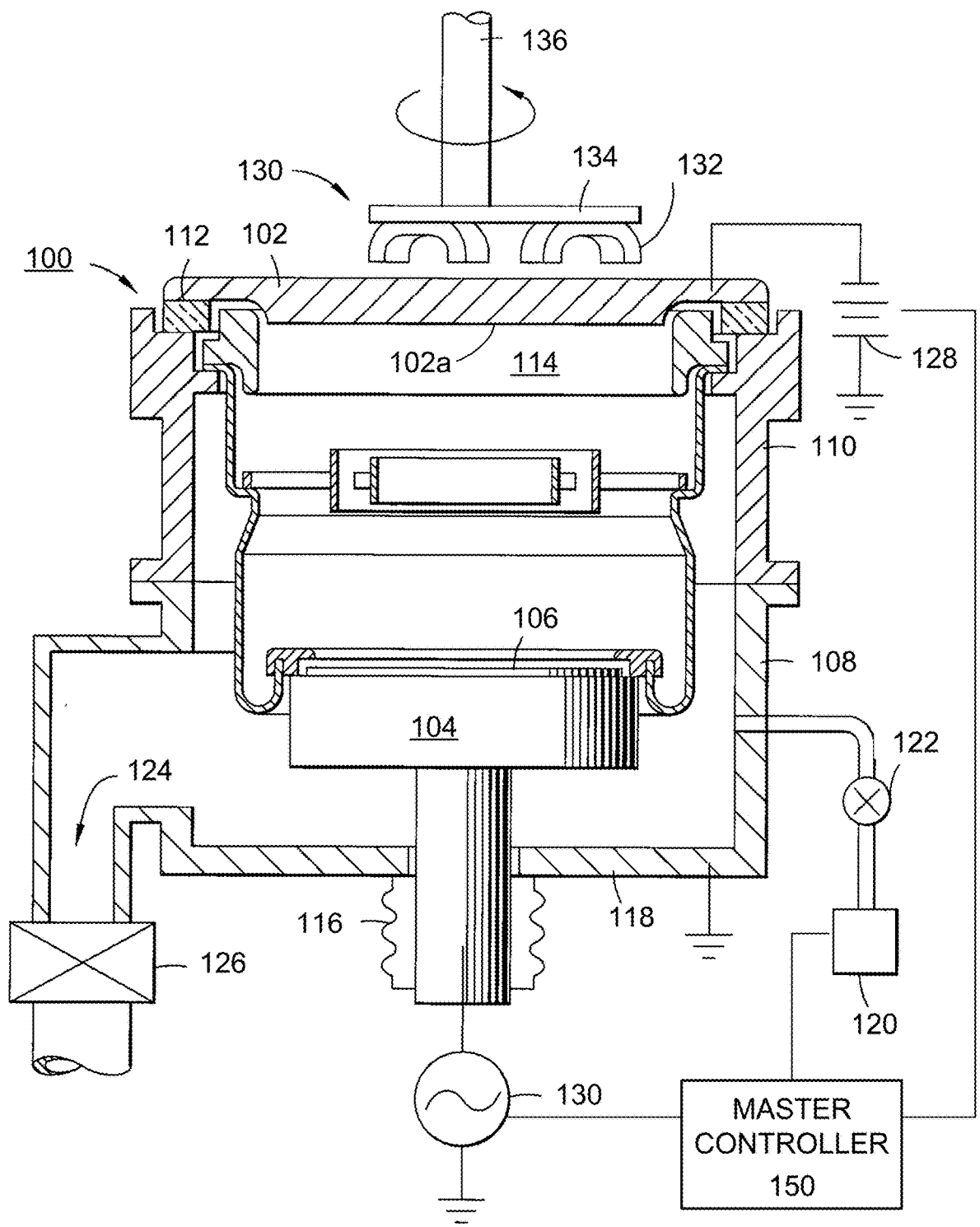
FIG. 1 is a cross-section of a simplified plasma processing chamber of a substrate processing system, the plasma processing chamber having a coil disposed therein.

To facilitate understanding, identical reference numerals have been used, where possible, to designate identical elements that are common to the figures. The figures are not drawn to scale and may be simplified for clarity. Moreover, elements and features of one embodiment may be beneficially incorporated in other embodiments consistent with the present disclosure without further recitation.

DETAILED DESCRIPTION

Embodiments consistent with the present disclosure relate to the deposition of a compound material layer, upon one or more other material layers of a substrate, by physical vapor deposition under the action of an inert gas plasma. A cycle of sputter target poisoning is performed, by exposing a surface of the sputter target to a reactive gas plasma within a plasma processing chamber, to form a thin film layer of compound material on the sputter target. After each poisoning cycle, the layer of compound material just formed, by reaction of the reactive gas ions with the metal or metal alloy comprising the sputter target, is bombarded with ions of an inert gas plasma to directly sputter a thin film of the compound material onto a substrate. The process is repeated until the compound material layer formed upon the substrate has a specified thickness.

By way of illustrative example, a layer of metal oxide may be deposited as an etch stop and/or a barrier layer, by direct sputtering from a poisoned target surface according to one or more embodiments, over a low-k barrier layer covering one or more conductive metal interconnect(s). In some embodiments, a poisoned metal target having a film of metal oxide formed thereon is bombarded with ions of the inert gas plasma to sputter a layer of the metal oxide directly onto a barrier layer. In other embodiments, the poisoned metal target may have a film of metal nitride formed thereon.

As used herein, a poisoned target is one that has been treated, by exposure to a reactive plasma gas, to form a layer of compound material on the order of several atomic monolayers thick. The poisoning reaction is self-limiting in that the reaction terminates once a compound layer of several monolayers thick has formed over the target. After each cycle of compound material deposition is performed, a target may be "re-poisoned" by reintroducing the reactive plasma gas. The duration and/or number of deposition cycles, in turn, determines the final thickness of the compound material layer deposited by sputtering onto the substrate. By way of example, the reaction of ions of a reactive nitrogen plasma with exposed surfaces of an aluminum target may form a layer of aluminum nitride having a thickness of two atomic monolayers (i.e., 5 Å thick). A 30 Å thick layer of aluminum nitride on substrate may be formed by six cycles of target poisoning and sputtering.

One or more embodiments described below are implemented using a self-ionized plasma (SIP) process that can be carried out using process equipment such as a self-ionized plasma, physical vapor deposition (SIP-PVD) processing chamber known as an EnCoRe II™ Chamber, mounted on an Endura® platform, both of which are available from Applied Materials, Inc., located in Santa Clara, Calif. The equipment can include an integrated platform having a pre-clean chamber, a SIP-PVD barrier layer chamber, a PVD chamber, a SIP-PVD seed layer chamber, and a CVD chamber.

FIG. 1 is a schematic cross-sectional view of a SIP-PVD chamber (e.g., plasma processing chamber 100) of a substrate processing system. The plasma processing chamber 100 is adapted to perform dielectric thin-film deposition according to embodiments consistent with the present disclosure. Generally, the plasma processing chamber 100 contains a sputtering source, such as a target 102, and a substrate support 104 for receiving a substrate 106 thereon and located within a grounded enclosure wall 108. The target 102 is supported on and sealed, as by O-rings (not shown), to a grounded conductive aluminum adapter 110 through a dielectric isolator 112.

As will be described in greater detail shortly, the exposed surface 102a of target 102 is "poisoned", by reaction of exposed surface 102a with a plasma formed from a process gas such as oxygen or nitrogen, to form a thin compound layer at the target surface. During each of n sputtering cycles, where n is an integer greater to or equal to one, an inert gas plasma generated within the processing region 114 of plasma processing chamber 100 sputters the thin compound layer formed during a corresponding poisoning cycle directly onto substrate 106. Metals suitable for poisoning to produce compound layers consistent with embodiments of the present disclosure include such metals as aluminum, magnesium, cobalt, nickel, titanium, tantalum, tungsten, molybdenum, iron, niobium, palladium, and combinations thereof. For some embodiments, such as the fabrication of etch stop layers according to one or more exemplary embodiment, the target 102 may be formed of aluminum. For other embodiments, such as the formation of CeFeB/MgO/CoFeB-based film stacks in spin-torque-transfer random access memory (STT-RAM) circuits, the target 102 may be formed from magnesium. Though neither are shown, the target 102 may also include a bonded composite of a metallic surface layer and a backing plate of a more workable metal.

The substrate support 104 is vertically movable through a bellows 116 connected to a bottom chamber wall 118 to allow the substrate 106 to be transferred onto the substrate support 104 through a load lock valve (not shown) in the lower portion of the plasma processing chamber 100 and thereafter raised to a deposition position. In some embodiments, gas source 120 comprises a manifold (not shown) and is capable of delivering one or more gases, as appropriate, during each operating cycle. A mass flow controller 122 regulates the flow of gas into the processing region 114 of plasma processing chamber 100. In some embodiments, a separate gas source and valve is provided for controlling the delivery of each process gas into processing region 114.

During operation in "poison mode", during which a compound layer (not shown) already formed on exposed surface 102a of target 102 is directly sputtered onto substrate 106, an inert gas such as helium, neon, argon, krypton, or xenon (or a mixture thereof) is supplied from a gas source 120 through a mass flow controller 122 into the lower part of the plasma processing chamber 100. During operation in reactive gas re-poisoning mode, the compound layer removed by the immediately prior inert gas plasma sputtering cycle (i.e., during operation of plasma processing chamber 100 in poison mode) is replenished by supplying an appropriate processing gas through gas source 120 Gases exit the chamber through conduit 124 with valve 126.

A rotatable magnetron 130 is positioned in back of the target 102 and includes a plurality of magnets 132 supported by a base plate 134 connected to a rotation shaft 136 coincident with the central axis of the plasma processing chamber 100 and the substrate 106. The magnets 132 produce a magnetic field within the plasma processing chamber 100, generally parallel and close to the exposed surface 102a of the target 102 to trap electrons and increase the local plasma density, which in turn increases the sputtering rate.

In an embodiment, the plasma processing chamber 100 is controlled by a master controller 150 that is generally designed to facilitate the control and automation of the plasma processing chamber 100 and typically includes a central processing unit (CPU) (not shown), memory (not shown), and support circuits (or I/O) (not shown). The CPU may be one or more of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the master controller 150 determines which tasks are performable on a substrate. In embodiments, the program is software readable by the master controller 150 that includes code to perform tasks relating to monitoring, execution and control of the various process recipe tasks and recipe processes being performed in the plasma processing chamber 100. For example, the master controller 150 can comprise program code that includes a first gas flow control instruction set to operate one or more gas flow control valves to initiate a flow of a reactive plasma processing gas (e.g., oxygen or nitrogen) to the plasma processing chamber 100 during operating of the chamber in target poisoning mode and a second gas flow control instruction set to operate one or more gas flow control valves to initiate a flow of one or more inert plasma gases into plasma processing chamber 100 during operating of the chamber to sputter the compound layer onto the substrate 106.

Master controller 15 may also comprise program code that includes a gas pressure control instruction set to operate a throttle valve or gate valve to maintain a pressure in the plasma processing chamber 100; a temperature control instruction set to control a temperature control system (not shown) in substrate support 104 or grounded enclosure wall 108 to set temperatures of the substrate or grounded enclosure wall 108, respectively; and a process monitoring instruction set to monitor the process in the plasma processing chamber 100. By way of example, to prevent operation of plasma processing chamber 100 in poison mode beyond the point where a compound layer of dielectric material has been removed from exposed surface 102a, master controller 150 may monitor the flow of current through target 102 to ground. For the period of time where an oxide or nitride is still present on the exposed surface 102a of target 102, the resistance will remain above a threshold. However, once the compound layer has been removed, the resistance will fall below a threshold and the transition may be used to initiate the next target poisoning cycle.

Typically, the pressure of the sputtering gas in the plasma processing chamber 100 during processing is set to sub-atmospheric levels, such as a vacuum environment, for example, a pressure of about 1.0 millitorr to about 10.0 millitorr. In one embodiment, the processing pressure is set to about 2.5 millitorr to about 6.5 millitorr. A plasma is formed between the substrate 106 and the target 102 from the gas ions within the plasma are accelerated toward the poisoned layer of target 102 comprising a compound material (e.g., a metal oxide or metal nitride) and cause the compound material to become dislodged from the target 102. The dislodged compound material is deposited on the substrate.

Figure 2:
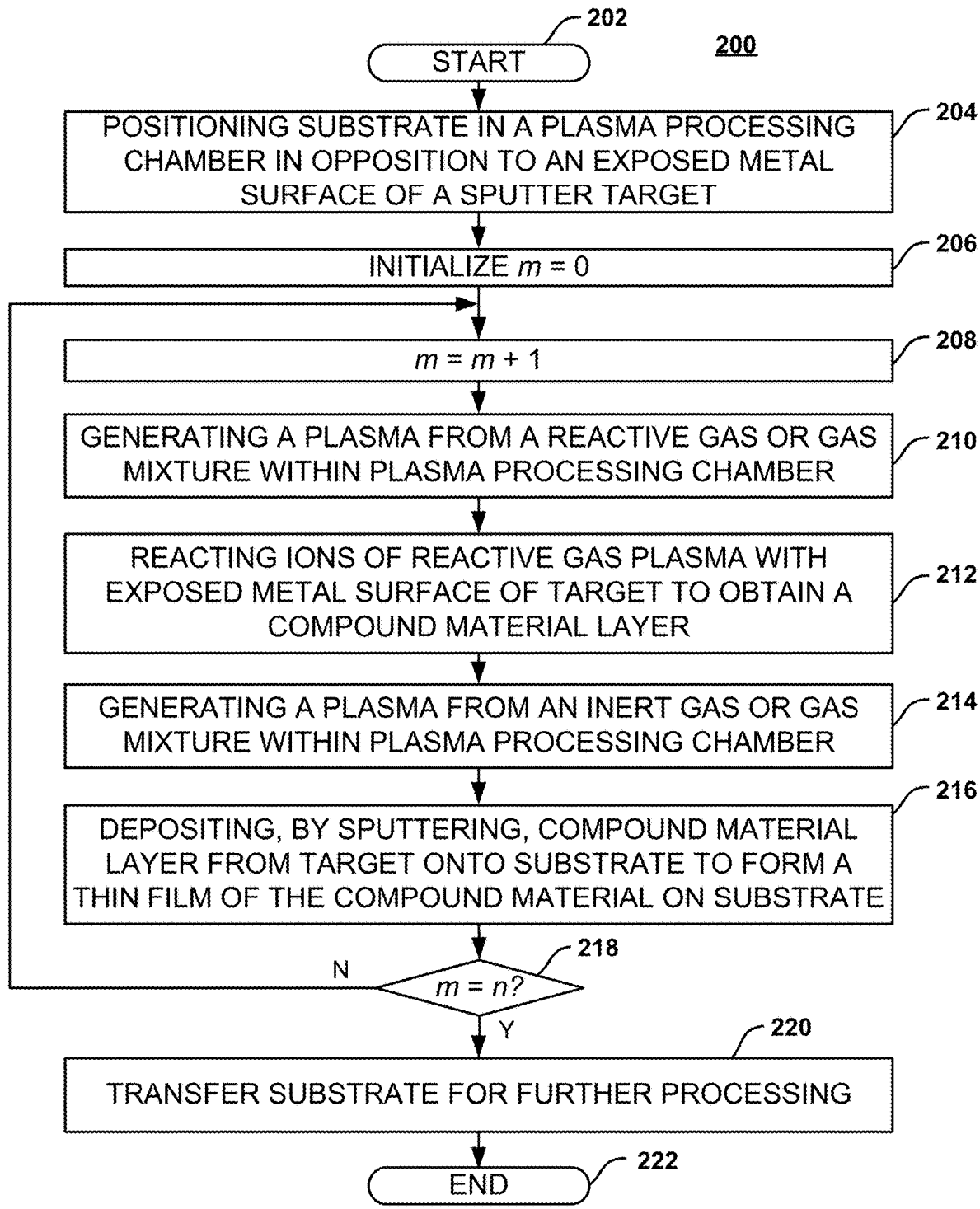
FIG. 2 is a flow diagram of a thin film deposition process according to embodiments consistent with the present disclosure.

FIG. 2 illustrates a process sequence 200 used to perform deposition of a compound material layer (e.g, a first layer) on a substrate according to an embodiment of the present disclosure. The process sequence 200 is entered at start block 202 and proceeds to block 204. At block 204, a substrate, such as the substrate 106 depicted in FIG. 1, is positioned into a plasma processing chamber, such as the plasma processing chamber 100 depicted in FIG. 1, or other suitable processing chamber. The substrate may have a substantially planar surface, an uneven surface, or a substantially planar surface having a structure formed thereon. In embodiments, the plasma processing chamber is capable of maintaining the substrate at a specific temperature, and biasing the substrate.

In one embodiment, the substrate may comprise a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 106 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In some embodiments, the substrate further comprises a low-k barrier covering a metal interconnect layer, and the compound material layer deposited by sputtering of material from a poisoned target forms an etch stop over the low-k barrier layer. The thicknesses of both the etch stop layer and the barrier layer may be on the order of 35 Å. As such thicknesses, interface interactions between the layers may have a more significant impact on device performance and reliability than the physical properties of the bulk materials from which the layers are formed. For example, in a conventional PVD oxide deposition process, the reactive oxygen ions may penetrate well into the barrier layer(s) and/or metal lines and alter the properties of those features as well as the films underneath.

In other embodiments, the substrate further comprises a first CoFeB layer for forming a spin-torque-transfer random access memory (STT-RAM), and the compound material layer deposited by sputtering of material from a poisoned target forms a tunneling barrier in a STT-RAM stack where CoFeB layers are separated by the tunneling barrier. In an embodiment, the target is magnesium and the compound material formed by poisoning the target is a magnesium oxide having fewer particle and non-uniformity issues as compared to conventional RF MgO reactive sputtering and Mg+ native oxide deposition schemes.

A native oxide layer present on the target may be removed from the target before proceeding with a controlled process of target poisoning in accordance with embodiments consistent with the present disclosure. The removal of the oxide layer may be performed prior to introduction of a substrate into the plasma processing chamber. In embodiments, an n cycle target poisoning and sputtering/re-sputtering process is performed on the substrate 106 to build a layer of compound material on the substrate 106, using the compound material formed by reacting exposed metal of the sputter target with ions of a reactive gas plasma, where n is an integer equal to or greater than one. At block 206, the process sequence 200 is initialized by setting the sputtering cycle counter m to zero. From block 206, the process sequence 200 proceeds to block 208, where the cycle counter m is incremented by one. The process sequence 200 proceeds to block 210.

At block 210, a cycle of the n-cycle compound material sputtering process is initiated by generating a plasma from a reactive gas or mixture of reactive gases. At block 212, ions from the reactive gas plasma penetrate into the first several monolayers of the metal comprising the target. The reaction of plasma gas ions and target metal form a compound material layer. Each such reaction generates a source layer of compound material "for sputtering a corresponding deposited layer of compound material onto the substrate. The reaction of plasma gas ions with the target metal is a self-limiting reaction in that once a layer of compound material on the order of several monolayers thick has formed, the ions of the plasma can no longer penetrate beyond the poisoned layer of compound material to react with the metal underneath. In an embodiment, the target is comprised of aluminum and oxygen is flowed into the plasma processing chamber at a temperature of 180 to 220° C. and a pressure of 5-12 millitorr. A negative DC bias on the order of between about 200 W and about 300 W is applied to the target. In some embodiments, an RF power source provides RF power at a frequency on the order of 1 to 10 kW to the target as well. The poisoning reaction at block 212 may take on the order of 10 to 30 seconds. An aluminum oxide layer of two monolayers thick may take on the order of about 21 seconds.

At block 214, a plasma is generated from an inert gas or gas mixture within the plasma processing chamber. The inert gas or inert gas mixture may comprise any of argon, krypton, or xenon, or a mixture thereof, and may further include helium or neon. At block 216, the substrate is maintained at a temperature of from about 180 to about 220° C., while the plasma chamber is maintained at a pressure on the order of from about 1 to about 4 millitorr. A suitable DC bias, on the order of about 200 to 300 W and is applied to the target for a time period on the order of about 30 to about 60 seconds. In one embodiment, the inert gas which may be supplied into the vacuum processing region of the plasma processing chamber is argon at a volumetric flow rate between about 200 sccm and about 1500 sccm.

Figure 3:
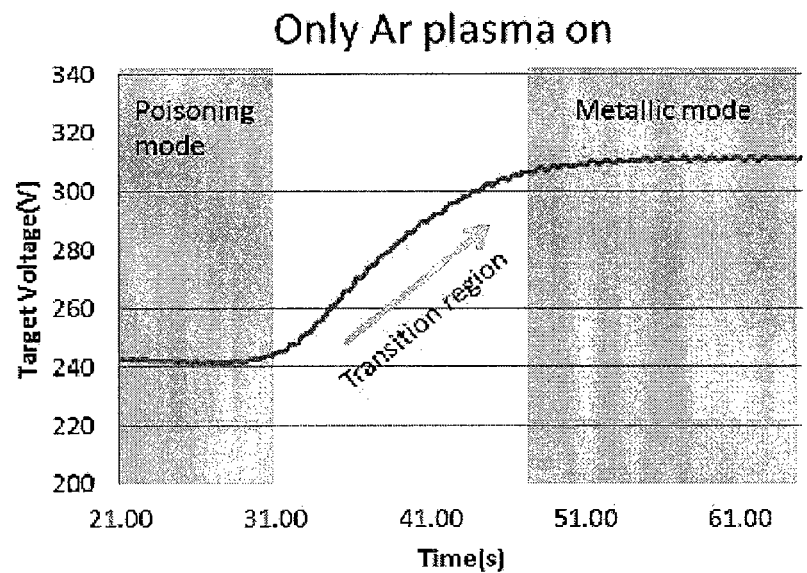
FIG. 3 is a graphical representation of voltage with respect to time to show the change in impedance across the region of transition between the interval where compound material to be sputtered is still present on the metal target surface and the interval over which the remaining compound material has been sputtered away to expose the bare metal surface of the target.

FIG. 3 is a graphical representation of voltage with respect to time for an embodiment exemplified by block 216 and consistent with the present disclosure. In particular, FIG. 3 illustrates an exemplary change in impedance across a period of transition (i.e., a second interval) between a first interval where compound material to be sputtered is still present on the metal target surface and a third interval where the compound material has been sputtered away to expose the bare metal surface of the target. As the poisoned layer of compound material (e.g, a metal oxide) is depleted, the impedance (and voltage) begin to climb quickly during the transition region until the knee of the curve is reached at about 49 seconds. At some point during the third interval, the poisoned layer of compound material has been removed by sputtering from the target such that termination of the process exemplified by block 216 is appropriate. From block 216, process sequence 200 advances to block 218.

Figure 4A:
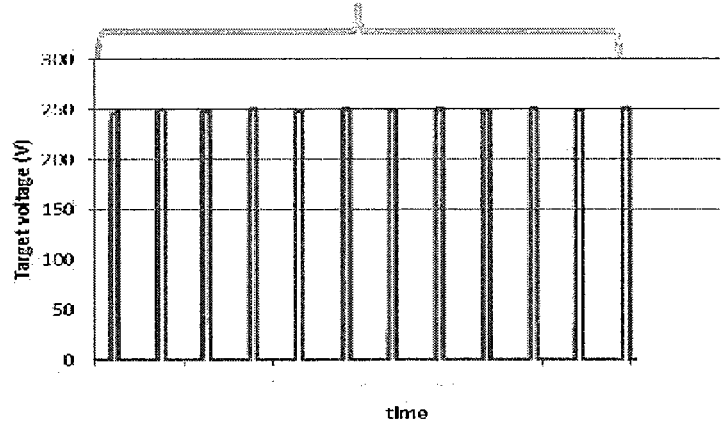
FIG. 4A is a graphical representation depicting a series of n cycles of compound layer sputtering from target according to an embodiment consistent with the present disclosure, where each of the n cycles is followed by a corresponding target poisoning and n is equal to 6.
Figure 4B:
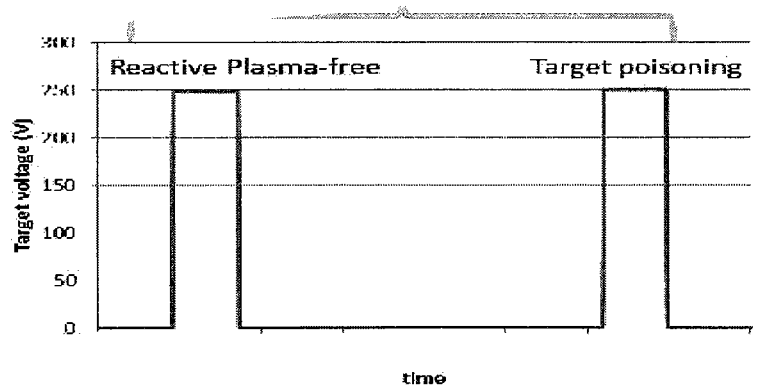
FIG. 4B is an expanded view of the graphical representation of FIG. 4A, showing that the target compound layer sputtering cycle and target poisoning cycle are approximately equal in duration.

At 218, a determination is made as to whether an appropriate number of target poisoning and compound layer sputtering cycles has been reached. If not, the process sequence 200 returns to block 208 and the cycle counter m increments by one. FIG. 4A is a graphical representation depicting a series of n cycles of compound layer sputtering from target according to an embodiment consistent with the present disclosure, where each of the n cycles is followed by a corresponding target poisoning and n is equal to 6. FIG. 4B is an expanded view of the graphical representation of FIG. 4A, showing that the target compound layer sputtering cycle and target poisoning cycle are approximately equal in duration.

Figure 5A:
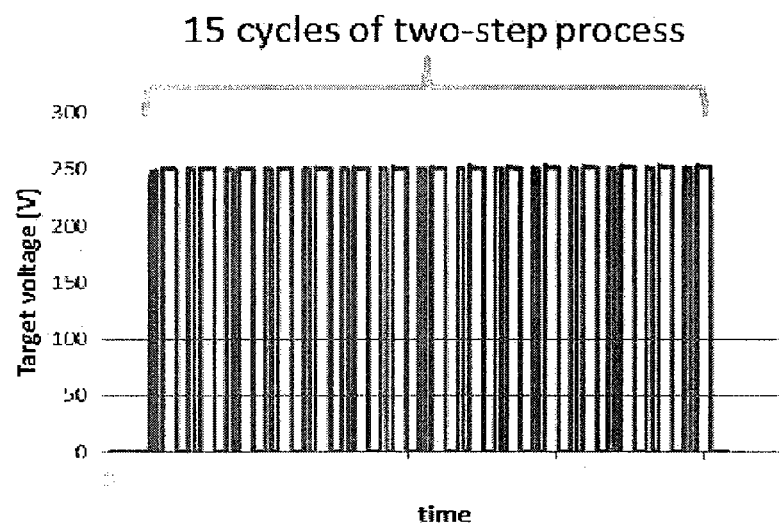
FIG. 5A is a graphical representation depicting a series of n cycles of compound layer sputtering from target according to an embodiment consistent with the present disclosure, where each of the n cycles is followed by a corresponding target poisoning cycle and n is equal to 15.
Figure 5B:
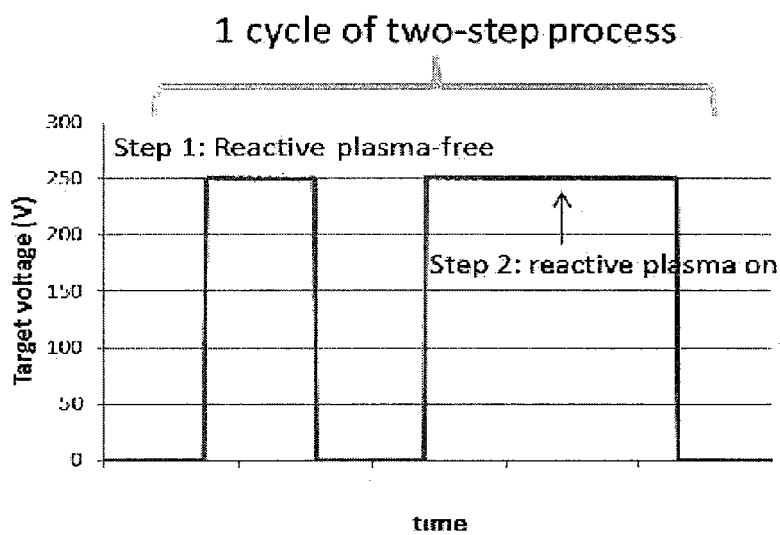
FIG. 5B is an expanded view of the graphical representation of FIG. 5A, showing that the duration of the target poisoning cycle is substantially longer than the target compound layer sputtering cycle.

FIG. 5A is a graphical representation depicting a series of n cycles of compound layer sputtering from target according to an embodiment consistent with the present disclosure, where each of the n cycles is followed by a corresponding target poisoning cycle and n is equal to 15. FIG. 5B is an expanded view of the graphical representation of FIG. 5A, showing that the duration of the target poisoning cycle is substantially longer (on the order of 2× to 5×) than the target compound layer sputtering cycle.

If, at block 218, a determination is made that the final sputtering cycle has been performed at block 216, the process sequence proceeds to block 220. In some embodiments, a final target poisoning process may optionally be carried out to set the plasma processing chamber up for the next sputtering operation. At block 220, the substrate 106 may be transferred to another processing chamber of the substrate processing system for further substrate processing operations (e.g., etching, mask deposition, etc.). The process sequence 200 terminates at 222.

While the foregoing is directed to embodiments of the present disclosure, other and further embodiments consistent with the present disclosure may be devised without departing from the basic scope thereof.

The invention claimed is:
1. A method of depositing a layer of compound material on a substrate, comprising:
    removing a native oxide layer from a sputter target before introduction of the substrate;
    flowing a reactive gas into a plasma processing chamber having the substrate to be sputter deposited disposed therein in opposition to the sputter target comprising a metal;
    exciting the reactive gas into a reactive gas plasma to react with the sputter target and to form a first layer of compound material on the sputter target, wherein the first layer of compound material is a metal oxide or metal nitride with a thickness of 1 or 2 monolayers;
    flowing an inert gas into the plasma processing chamber; and
    exciting the inert gas into a non-reactive gas plasma to sputter the first layer of compound material from the sputter target to the substrate to form a second layer of compound material on the substrate.
2. The method of claim 1, wherein the metal of the sputter target is aluminum and wherein the first layer of compound material is aluminum oxide or aluminum nitride.

3. The method of claim 1, wherein the metal of the sputter target is magnesium and wherein the first layer of compound material is magnesium oxide.

4. The method of claim 1, wherein the inert gas is at least one of helium, neon, argon, krypton, or xenon.

5. The method of claim 4, wherein flowing an inert gas into the plasma processing chamber comprises flowing a plurality of inert gases into the plasma processing chamber.

6. The method of claim 5, wherein the plurality of inert gases includes at least one of helium or neon.

7. The method of claim 1, further comprising:
in a second reactive gas flowing cycle following sputter deposition of the second layer of compound material on the substrate, flowing a reactive gas of the second reactive gas flowing cycle into the plasma processing chamber; and
exciting the reactive gas of the second reactive gas flowing cycle into a reactive gas plasma to react with the sputter target and form a replacement layer of compound material on the sputter target.

8. The method of claim 7, further comprising:
in a second inert gas flowing cycle, flowing an inert gas into the plasma processing chamber, and
exciting the inert gas of the second inert gas flowing cycle into a plasma to sputter the replacement layer from the sputter target to the substrate to form an additional layer of compound material on the substrate.

9. A substrate processing system, comprising:
a plasma processing chamber;
a sputter target comprising a metal;
a substrate support dimensioned and arranged within the plasma processing chamber to receive and support a substrate in opposition to the sputter target comprising a metal; and
a controller comprising a processor and a memory, the memory containing instructions executable by the controller for depositing a layer of compound material on the substrate by:
removing a native oxide layer from the sputter target before introduction of the substrate:
flowing a reactive gas into the plasma processing chamber having the substrate to be sputter deposited disposed therein in opposition to the sputter target comprising a metal;
exciting the reactive gas into a reactive gas plasma to react with the sputter target and to form a first layer of compound material on the sputter target, wherein the first layer of compound material is a metal oxide or metal nitride with a thickness of 1 or 2 monolayers;
flowing an inert gas into the plasma processing chamber; and
exciting the inert gas into a non-reactive gas plasma to sputter the first layer of compound material from the sputter target to the substrate to form a second layer of compound material on the substrate.

10. The substrate processing system of claim 9, wherein the controller executes instructions for flowing oxygen into the plasma processing chamber to form a metal oxide on the substrate.

11. The substrate processing system of claim 9, wherein the controller executes instructions for flowing nitrogen into the plasma processing chamber to form a metal nitride on the substrate.

12. The substrate processing system of claim 9, wherein the metal of the sputter target is aluminum.

13. The substrate processing system of claim 9, wherein the controller executes instructions for evacuating the reactive gas from the plasma processing chamber when the first layer of compound material at expiration of a time interval corresponding to deposition of a layer of compound material at the thickness of 1 or 2 monolayers.

14. The substrate processing system of claim 9, wherein the controller executes instructions for determining when the first layer of compound material has been depleted by sputter deposition of the second layer of compound material onto the substrate.

15. The substrate processing system of claim 9, wherein the controller executes instructions for:
in a second reactive gas flowing cycle following sputter deposition of the first second layer of compound material on the substrate, flowing a reactive gas of the second reactive gas flowing cycle into the plasma processing chamber; and
exciting the reactive gas of the second reactive gas flowing cycle into a reactive gas plasma to react with the sputter target and form a replacement layer of compound material on the sputter target.

16. The substrate processing system of claim 15, wherein the controller executes instructions for:
in a second inert gas flowing cycle, flowing an inert gas into the plasma processing chamber, and
exciting the inert gas of the second inert gas flowing cycle into a non-reactive plasma to sputter the replacement layer of compound material on the sputter target to the substrate to form an additional layer of compound material on the substrate.

17. The substrate processing system of claim 9, wherein the inert gas comprises at least one of helium, neon, argon, krypton, or xenon.

18. A method of depositing a layer of compound material on a substrate, comprising:
removing a native oxide layer from a sputter target before introduction of the substrate;
flowing a reactive gas into a plasma processing chamber having the substrate to be sputter deposited disposed therein in opposition to the sputter target comprising a metal;
exciting the reactive gas into a reactive gas plasma to react with the sputter target and to form a first layer of compound material thereon, wherein the first layer of compound material is a metal oxide or metal nitride with a thickness of 1 or 2 monolayers;
flowing an inert gas into the plasma processing chamber;
exciting the inert gas into a non-reactive gas plasma to sputter the first layer of compound material from the sputter target to the substrate to form a second layer of compound material on the substrate;
in a second reactive gas flowing cycle following sputter deposition of the second layer of compound material on the substrate:
flowing a reactive gas of the second reactive gas flowing cycle into the plasma processing chamber; and
exciting the reactive gas of the second reactive gas flowing cycle into a reactive gas plasma to react with the sputter target and form a replacement layer of compound material on the sputter target; and
in a second inert gas flowing cycle:
flowing an inert gas into the plasma processing chamber, and exciting the inert gas of the second inert gas flowing cycle into a plasma to sputter the replacement layer from the sputter target to the substrate to form an additional layer of compound material on the substrate.

\* \* \* \* \*